United States Patent [19]

McGeary et al.

[11] Patent Number: 5,721,176

[45] Date of Patent: Feb. 24, 1998

[54] USE OF OXALYL CHLORIDE TO FORM CHLORIDE-DOPED SILICON DIOXIDE FILMS OF SILICON SUBSTRATES

[75] Inventors: Michael J. McGeary, Meriden; Herman J. Boeglin, South Meriden, both of Conn.

[73] Assignee: Olin Corporation, Norwalk, Conn.

[21] Appl. No.: 891,484

[22] Filed: May 29, 1992

[51] Int. Cl.$^6$ ................................. H01L 21/469
[52] U.S. Cl. .................. 438/774; 438/770; 438/787; 438/790
[58] Field of Search ................. 437/235, 238, 437/240

[56] References Cited

U.S. PATENT DOCUMENTS

| | | | |
|---|---|---|---|
| 2,816,140 | 12/1957 | Ellingboe | 562/843 |
| 3,793,263 | 2/1974 | Morris | 502/228 |
| 4,606,935 | 8/1986 | Blum . | |
| 4,612,258 | 9/1986 | Tsang . | |

FOREIGN PATENT DOCUMENTS

| | | |
|---|---|---|
| 0405205 | 6/1990 | Japan . |

OTHER PUBLICATIONS

Ghandhi, *VLSI Fabrication Principles*, Wiley, N.Y. 1983, pp. 381, 382, 385–391.

Wolf, *Silicon Processing for the VLSI Era*, Lattice Press, CA, 1986, pp. 198, 199, 205–208, 215–216.

Aldrich Technical Information Bulletin for Oxalyl Chloride, 1980.

J. Monkowski and J. Stach, "System Characterization of Planar Source Diffusion", Solid State Technology, Nov., 1976.

Mao-Chieh Chen and John W. Hile, "Oxide Charge Reduction by Chemical Gettering with Trichloroethylene During Thermal Oxidation of Silicon", J. Electrochem Soc.: Solid-State Science & Technology, Feb. 1972, pp. 223–225.

R. E. Tressler, J. Stach, and D. M. Metz, "Thermal Oxidation of Silicon in Cl–H–O"; J. Electrochm Soc.: Solid-State Science & Technology, Apr. 1977, pp. 607–609.

T. Hattori, "Elimination of Stacking Faults in Silicon by Trichloroethylene Oxidation"; J. Electrochem Soc.: Solid-State Science & Technology, Jun. 1976, pp. 945–946.

B. R. Singh and P. Balk, "Chlorine and Chlorine Compounds"; J. Electrochem Soc.: Solid-State Science & Technology, Mar., 1978, pp. 453–461.

D. L. Heald, R. M. Das, and R. P. Khosla, "Influence of Trichloroethylene on Room Temperature Flatband Voltages of MOS Capacitors"; J. Electrochem Soc.: Solid-State Science & Technology, Mar., 1976, pp. 302–303.

I. Folkins and G. Brasseur, "The Chemical Mechanisms Behind Ozone Depletion"; Chemistry & Industry, 20 Apr. 1992, pp. 294–297.

J. Monkowski, "Role of Chlorine in Silicon Oxidation" Part I and II; Solid State Technology, Jul. and Aug., 1979.

T. Hattori, "Gettering of Stacking-Fault Nuclei in Silicon by Trichloro-ethylene Oxidation" Applied Physics Letters vol. 30, #7, Apr. 1, 1977–pp. 312–314.

G.J. Declerck, T. Hattori, G.A. May, J. Beaudouin, and J.D. Meindl, "Some Effects of 'Trichloroethylene Oxidation' on the Characteristics of MOS Devices"; J. Electrochem Soc.: Solid-State Science & Technology, Mar., 1975, pp. 436–439.

P. Peykov, T. Diaz, M. Aceves, M. Linarea, and W. Calleja, "Influence of Low Temperature Chlorinated Oxides on Structures"; Revista Mexicana de Fisica, 35 No. 1 (1989), pp. 75–82.

*Primary Examiner*—Trung Dang
*Attorney, Agent, or Firm*—William A. Simons; Wiggin & Dana

[57] ABSTRACT

A process of forming chlorine-doped silicon dioxide films on a silicon substrate comprising oxidizing said silicon substrate in the presence of a chlorine source, thereby forming said chlorine-doped silicon dioxide film on said silicon substrate, said chlorine source being oxalyl chloride.

9 Claims, No Drawings

USE OF OXALYL CHLORIDE TO FORM CHLORIDE-DOPED SILICON DIOXIDE FILMS OF SILICON SUBSTRATES

BACKGROUND OF THE INVENTION

1. Field of the Invention

The present invention is directed to the process of incorporating chlorine into a silicon dioxide film. In particular, the present invention is directed toward oxidizing a silicon substrate in the presence of a chlorine source, said chlorine source being oxalyl chloride.

2. Brief Description of the Art

Chlorine-doped silicon dioxide films have great utility in the fabrication of commercial integrated circuits. Chlorine is generally incorporated into silicon dioxide films by thermally oxidizing silicon substrates such as silicon wafers in the presence of a chlorine source.

Incorporation of chlorine into silicon dioxide films during film growth results in several material performance benefits. These include: (i) passivation of mobile charges in the oxide; (ii) enhanced minority carrier lifetimes in the underlying silicon; (iii) increased dielectric strength of the oxide layer; (iv) suppression of stacking faults in the underlying silicon. In addition, the presence of chlorine in the oxidation environment is known to increase the growth rate of the formed silicon dioxide film or layer.

In the early years of commercial integrated circuit manufacture, hydrogen chloride gas was used as the chlorine source chemical in chlorine-doped silicon dioxide films on layers. Although HCl was effective for this application, several drawbacks were encountered. Because hydrogen chloride gas is very corrosive, deterioration of metal feed lines and other metal components in the gas management system was observed. Corrosion at the cylinder valve and within the gas management system was the source for particulate contamination of the silicon dioxide films and silicon substrates. Furthermore, the mandatory safety procedures needed to cope with the use of pressurized cylinders of this corrosive, toxic gas were costly and time consuming.

Because of these drawbacks, the industry replaced HCl with 1,1,1-trichloroethane (TCA) as the chlorine source for making chlorine-doped silicon dioxide films or layers. TCA is a volatile liquid which is far less corrosive to metal parts than HCl. However, recent studies by environmental scientists showed that TCA along with chlorofluorocarbons are responsible for the destruction of stratospheric ozone. The Clean Air Act has slated that the production and use of TCA shall be phased out by the year 2002. Strong interim reduction measures have also been mandated by the Clean Air Act. In response to this legislative action, integrated circuit manufacturers plan to abandon TCA as a chlorine source as quickly as possible. Alternative source chemicals are urgently sought by integrated circuit manufacturers. The present invention is an excellent solution to that need.

BRIEF SUMMARY OF THE INVENTION

One aspect of the present invention is directed to a process of forming chlorine-doped silicon dioxide films on a silicon substrate comprising oxidizing said silicon substrate in the presence of a chlorine source, thereby forming said chlorine-doped silicon dioxide film on said silicon substrate, said chlorine source being oxalyl chloride.

Another aspect of the present invention is directed to a process for removing metal contaminants from tube furnace walls comprising (1) passing an oxalyl chloride-containing gas through said tube furnace at a temperature from about 700° C. to about 1,200° C. to react with said metal contaminants, forming volatile metal chlorides; and (2) exhausting said metal chlorides from said tube furnace.

DETAILED DESCRIPTION

The present process of forming chlorine-doped silicon dioxide films on a silicon substrate may be used to produce films or layers having a refractive index in the range from about 1.46±0.02; more preferably, refractive index in the range from 1.46±0.01. The "chlorine-doped silicon dioxide" as employed in the present specification and claims refer to a film or layer which is substantially silicon dioxide and contains small percentage of chlorine (less than about 5% by atomic percent chlorine).

The silicon substrates employed in the present process may be any silicon material on which a chloride-doped silicon dioxide layer is desired. Silicon wafers and polysilicon films on semiconductor substrates are the preferred silicon substrates. Silicon wafers are the most preferred.

Oxalyl chloride has the following structural formula:

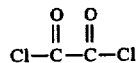

Oxalyl chloride has several desirable characteristics. First, it is not an ozone depleter. Upon exposure to the atmosphere, it reacts with water to form oxalic acid, hydrogen chloride, and oxalic acid dihydrate. Oxalic acid and oxalic acid dihydrate are stable, crystalline solids which are believed to eventually degrade in the environment to carbon monoxide, carbon dioxide, and water. Second, oxalyl chloride decomposes into chlorine and carbon dioxide under oxidation reaction process conditions. Third, since the vapor pressure of oxalyl chloride exceeds that of TCA, oxalyl chloride may be used with the same type of vapor delivery equipment used to deliver TCA.

The second reactant gas may be any oxygen-containing gas. Pure oxygen gas is the preferred oxygen-containing gas.

The gases may be introduced into the reaction chamber by separate inlet lines, or they may be premixed in a mixing manifold. The oxalyl chloride and oxygen-containing gas as well as any carrier gases for oxalyl chloride (e.g., nitrogen or helium) are preferably introduced in substantially laminar flow over the silicon substrate surface. The residence time over the substrate is kept short to eliminate substantial concentration variations over the wafer. The substrate, typically a silicon wafer, is preferably confined in a manner to provide a reaction chamber wall to wafer edge spacing and wafer to adjacent wafer spacing, such that chlorine-doped silicon dioxide films produced by the process of this invention are substantially uniform across the wafer surface, i.e., do not exhibit substantial concavity (edge build-up) or convexity (center mounding). Film uniformity obtained preferably exhibits less than ±3% thickness variation, both within (across) the wafers, and from wafer-to-wafer in a batch or production run.

While not critical, it is preferred to maintain the reaction chamber isothermal by which is meant having temperature variation throughout of less than 2° C., more preferably, less than 1° C., differences. The reactant gases are introduced at ambient temperature at a sufficient distance from the wafers to be coated to permit the gases to reach reaction temperatures. Compared to the silicon wafer mass being treated, the masses of the gases are not sufficient to appreciably cool the treated wafer.

The gas flow rates of the oxalyl chloride and the oxygen-containing gas will depend upon the type of reaction zone (e.g., tube furnace) employed as well as the type of carrier gas used with the oxalyl chloride. Typical gas flow rates may be on the order of about 10 to about 2,000 standard cc/minute (sccm) for both oxalyl chloride in nitrogen carrier gas, as well as a pure oxygen gas stream.

Preferably, the amount of oxalyl chloride added to reaction zone will be from 0.1 to about 5% by volume of the oxygen also added to the reaction zone.

While the reaction chamber pressures may include both subatmospheric and superatmospheric pressures, atmospheric pressure is preferred because of cost and ease of operation considerations.

The reaction temperatures employed are preferably from about 700° C. to about 1,200° C.; more preferably from about 800° C. to about 1,150° C.

The film formation rate is typically in the range from about 5 to about 40 angstroms per minute; preferably, from about 10 to about 35 angstroms per minute; and more preferably from about 20 to about 30 angstroms per minute.

During a preferred operation of the present invention, at an elevated temperature (e.g., 1,100° C.), an oxygen flow impinges on the hot surface of the silicon wafer thereby forming $SiO_2$. As the oxide layer increases in thickness, oxygen must first diffuse through the $SiO_2$ overcoat in order to react with silicon at the $Si/SiO_2$ interface to continue film growth. When oxalyl chloride is introduced into the oxidation tube, the oxalyl chloride is transformed into carbon dioxide and chlorine. Carbon dioxide exits the oxidation tube unchanged but a portion of the chlorine impinges on the wafer surface and reacts with silicon at the $Si/SiO_2$ interface to form chlorosiloxane inclusions.

While the present invention is directed primarily at the use of oxalyl chloride as a source chemical for chlorine in forming chlorine-doped silicon dioxide films or layers, another embodiment is directed toward using oxalyl chloride to remove contaminates from the interior of silicon oxidation process tubes. These contaminants, such as sodium ions, are transferred onto the process tube walls by diffusion from outer metal layers of the tube furnace during use. Their presence generate undesirable mobile charges in the formed silicon dioxide layer. In the past, the silicon oxidation process tubes were subjected to a cleaning protocol which involved exposure to $Cl_2$ gas at high temperatures (about 1,000° C.) to react with and remove said contaminants.

Such harmful effects caused by various alkali metal or alkali earth metal contaminants and/or transition metal contaminants include degradation of minority carrier lifetimes; increases of junction leakages; and shifts in the flat band voltage. When oxalyl chloride is introduced into the oxidation tube, the oxalyl chloride is transformed into carbon dioxide and chlorine. Carbon dioxide exits the oxidation tube unchanged but a portion of the chlorine impinges on the oxidation tube walls. Presumably, metallic impurities in the tube wall react with the chlorine to form metal chloride compounds with sufficient volatility to be exhausted from the tube.

The following Example and two Comparisons further illustrate the present invention. All parts and percentages are by weight and all temperatures are degrees Celsius unless explicitly stated otherwise.

COMPARISON 1

Growth of Silicon Dioxide Films; Dry Oxidation

A Sybron Model F-21120 horizontal tube furnace, available from Thermolyne Corporation of Dubuque, Iowa, was used with a fused silica tube with 33 mm internal diameter and 36 inches long. The furnace was equilibrated at 1,100° C. A sample of <100> silicon consisting of one-half of a two inch wafer was introduced parallel into the center line of the tube furnace. After a 5 minute time period to equilibrate the half wafer to 1,100° C., a flow of dry oxygen was begun (600 sccm) through an end plate on the furnace tube. After 60 minutes, the flow of oxygen was discontinued and the tube was flushed with a flow of nitrogen (1,000 sccm). Flow control of the gases was accomplished by using Tylan General Model UC2-31 mass flow controllers available from Tylan General Inc. of San Diego, Calif. All gas flows were carried out at atmospheric pressure. The half wafer was removed from the furnace and the thickness and refractive index of the oxide which was grown was measured by use of a laser ellipsometer employing a wavelength of 6,328 A. The half wafer was returned to the furnace and the oxidation step repeated such that readings were taken after a total oxidation time of 1, 2, 3, and 6 hours. The results are given in Tables 1 and 2 below.

After the six hours of oxidation, the oxide film formed was analyzed by Secondary Ion Mass Spectrometry (SIMS) for silicon, oxygen, and chlorine content. Only silicon and oxygen were detected on this half wafer. Samples of the effluent gas stream from the tube furnace during the oxidation steps were analyzed by a Resident Gas Analyzer (RGA) employing a quadrupole mass spectrometer. Data were collected for m/z values from 33 to 200. Peaks were detected at 33, 40, and 44. The peak at 44 was assigned to carbon dioxide. This RGA spectrum provides a background spectrum useful for interpreting the RGA spectra collected in Example 1 and Comparison 2.

EXAMPLE 1

Growth of Chlorinated Silicon Dioxide Films Using Oxalyl Chloride

Using the same equipment setup as Comparison 1, the same procedure was followed as outlined, except that a flow of oxalyl chloride was introduced during oxidation through the end plate on the furnace tube. A 500 cc liquid source quartz ampule, available from Olin Hunt Diffusion Products located in Seward, Ill., containing the oxalyl chloride was held at a constant temperature of 24° C. by use of a Model 725 source controller also available from Olin Hunt Diffusion Products. A nitrogen carrier gas (26.5 sccm) was fed through the oxalyl chloride by means of a dip tube in the liquid and using a Tylan General Model UC2-31 mass flow controller. This flow of carrier resulted in a concentration of oxalyl chloride during oxidation equivalent to 1.5% by volume of oxygen which is equivalent to 1.5% by volume $Cl_2$ in the furnace. The measured thicknesses and refractive indexes are also shown in Tables 1 and 2 below.

After the six hour oxidation, a SIMS analysis of the oxide film formed detected only silicon, oxygen, and chlorine. Samples of the effluent gas stream from the tube furnace during the oxidation segments were analyzed by a residual gas analyzer employing a quadrupole mass spectrometer. Data were collected for m/z values from 33 to 200. In addition to the background peaks, peaks were detected at 70 and 72 which were assigned to chlorine. These RGA data demonstrate the clean conversion of oxalyl chloride to $CO_2$ and $Cl_2$ under process conditions.

COMPARISON 2

Growth of Chlorinated Silicon Dioxide Films Using 1,1,1-Trichloroethane

The same procedure was followed, as outlined in Example 1, except that a flow of 1,1,1-trichloroethane (TCA) was introduced during oxidation. The nitrogen carrier flow rate was equal to 39 sccm. This flow of carrier resulted in a concentration of 1,1,1-trichloroethane during oxidation equivalent to 1% by volume of oxygen which is the theoretical equivalent to 1.5% by volume $Cl_2$ in the furnace (neglecting the reaction of $H_2O$ and $Cl_2$). The measured thicknesses and refractive indexes are also shown in Tables 1 and 2 below. After the six hour oxidation, a SIMS analysis of the oxide film formed detected only silicon, oxygen, and chlorine. Samples of the effluent gas stream from the tube furnace during the oxidation segments were analyzed by a residual gas analyzer employing a quadrupole mass spectrometer.

Data were collected for m/z values from 33 to 200. In addition to the background peaks, peaks were detected at 36, 38, 51, 70, and 72. The peaks at 36 and 38 were assigned to HCl; the peaks at 70 and 72 were assigned to chlorine. No assignment was made for the peak at 51.

TABLE 1

Oxide Film Thickness (A) as Measured by Ellipsometry

| Comparison or Example | Elapsed Time, Hours | | | | |
|---|---|---|---|---|---|
| | 1 | 1.33 | 2 | 3 | 6 |
| C-1 | 1,260 | — | 1,923 | 2,397 | 3,457 |
| E-1 | — | 2,015 | 2,567 | 3,120 | 4,380 |
| C-2 | 1,660 | — | 2,387 | 2,936 | 4,172 |

These data indicate that the addition of both oxalyl chloride and TCA both enhance the oxidation rate. The oxidation rate for oxalyl chloride is slightly higher than TCA and is believed to be due to the higher available $Cl_2$ level in oxalyl chloride.

TABLE 2

Retractive Index as Measured by Ellipsometry

| Comparison or Example | Elapsed Time, Hours | | | | |
|---|---|---|---|---|---|
| | 1 | 1.33 | 2 | 3 | 6 |
| C-1 | 1.457 | — | 1.452 | 1.460 | 1.459 |
| E-1 | — | 1.452 | 1.460 | 1.460 | 1.456 |
| C-2 | 1.455 | — | 1.460 | 1.460 | 1.452 |

These data indicate that the resulting silicon layer had approximately the same refractive index whether or not it was doped with chloride by the procedures given above.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process of forming chlorine-doped silicon dioxide films on a silicon substrate comprising oxidizing said silicon substrate in the presence of a chlorine source, thereby forming said chlorine-doped silicon dioxide film on said silicon substrate, said chlorine source being oxalyl chloride.

2. The process of claim 1 wherein said oxidization occurs at an isothermal temperature from about 700° C. to about 1,200° C.

3. The process of claim 1 wherein said oxidation occurs at atmospheric pressure.

4. The process of claim 1 wherein the film forming rate is from about 5 to about 40 angstroms per minute.

5. The process of claim 1 wherein the amount of oxalyl chloride is from 0.1% by volume to about 5% by volume of the oxygen employed.

6. A process for forming a chlorine-doped silicon dioxide layer having a refractive index of 1.46±0.02 onto a silicon substrate comprising the steps of:

(a) introducing oxalyl chloride and an oxygen-containing gas into a reaction zone containing said substrate on which chlorine-doped silicon dioxide film is to be formed;

(b) maintaining the temperature of said zone and said substrate at an isothermal temperature from about 800° C. to about 1,150° C.; and (c) passing said gases into contact with said substrate for a period of time sufficient to form a chlorine-doped silicon dioxide film having a refractive index from about 1.46±0.02.

7. The process of claim 6 wherein said silicon wafer is a silicon wafer.

8. The process of claim 7 wherein the film-forming rate is about 10 to about 35 angstroms per minute.

9. A process for removing metal contaminants from a tube furnace walls comprising:

(a) passing an oxalyl chloride-containing gas through said tube furnace at a temperature from about 700° C. to about 1,200° C. to react with said metal contaminants to form volatile metal chlorides; and (b) exhausting said metal chlorides from said tube furnace.

* * * * *